United States Patent [19]

Confalonieri et al.

[11] Patent Number: 4,799,042
[45] Date of Patent: Jan. 17, 1989

[54] APPARATUS AND METHOD FOR OFFSET VOLTAGE CORRECTION IN AN ANALOG TO DIGITAL CONVERTER

[75] Inventors: Pierangelo Confalonieri, Canonic D'Adda, Italy; Daniel Senderowicz, Berkeley, Calif.; Germano Nicollini, Piacenza, Italy

[73] Assignee: SGS Microelettronica S.p.A, Italy

[21] Appl. No.: 936,368

[22] Filed: Dec. 1, 1986

[30] Foreign Application Priority Data

Dec. 19, 1985 [IT] Italy ................. 23294 A/85

[51] Int. Cl.⁴ .............................................. H03M 1/06
[52] U.S. Cl. ...................................... 341/118; 341/150; 341/172
[58] Field of Search ................. 340/347 AD, 347 CC, 340/347 M

[56] References Cited

U.S. PATENT DOCUMENTS 4,399,426  8/1983  Tan ..................... 340/347 DA X
4,451,821  5/1984  Domogalla ............ 340/347 CC X Primary Examiner—William M. Shoop, Jr.
Assistant Examiner—Richard K. Blum
Attorney, Agent, or Firm—Victor Flores

[57] ABSTRACT

A charge redistribution analog-to-digital converter is described that permits their ncorporation of offset voltage correction to provide an accurate reflection in the digitalized output signal of the analog input signal. In a distributed capacitor successive approximation device, additional capacitors are added both to a most significant bit array group of capacitors and to a least significant array group of capacitors that are used in conjunction with the offset voltage. The value of the offset voltage is stored in a register and the register determines various switch positions that determine the value of the offset voltage incorporated in the final output voltage.

4 Claims, 3 Drawing Sheets

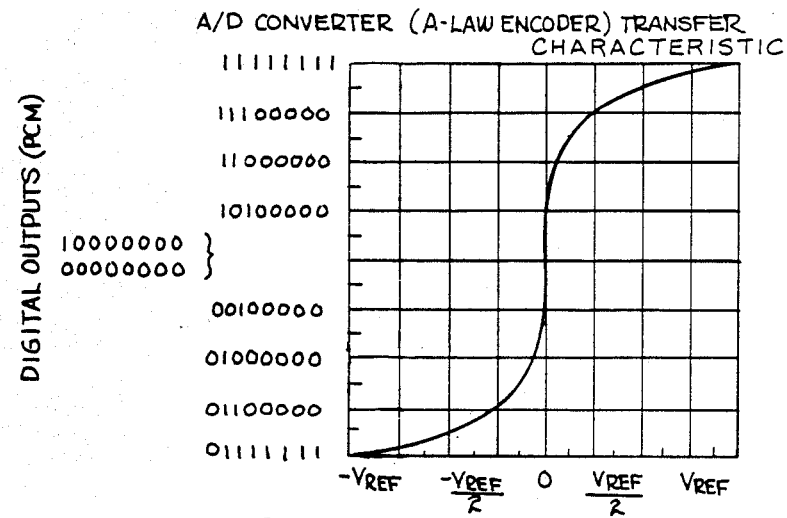
fig.1
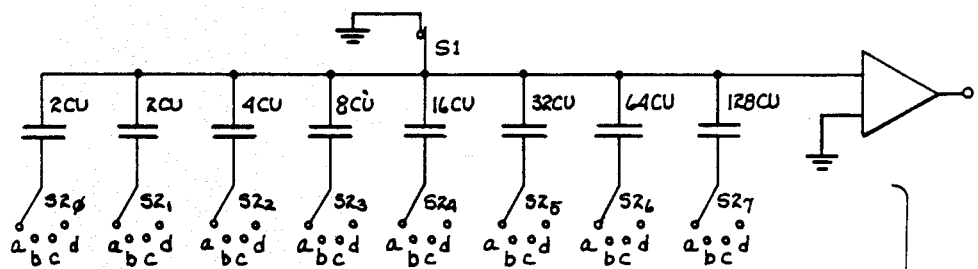
a = Vin
b = GND
c = ±VREF
d = OUTPUT OF THE LOWER OP. AMP
fig.2
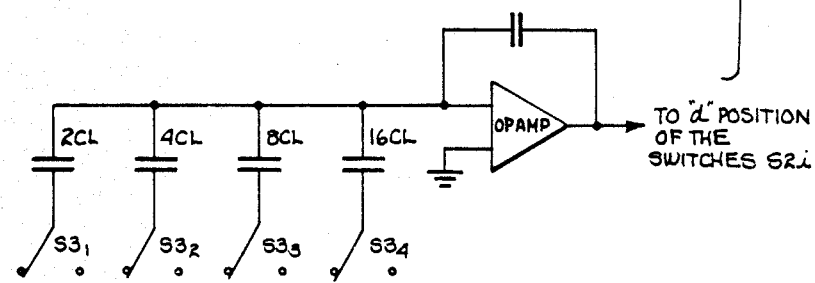
a = GND
b = ± VREF

E = EXCESS   D = DEFECT

APPARATUS AND METHOD FOR OFFSET VOLTAGE CORRECTION IN AN ANALOG TO DIGITAL CONVERTER

BACKGROUND OF THE INVENTION

1. Field of the Invention

This invention relates generally to analog to digital converters and, more particularly, to apparatus for correcting an input offset voltage by applying a correction signal to the input signal.

2. Description of the Related Art

It is well known in a Pulse Code Modulation circuit to provide an analog-to-digital converter to provide a digital output signal determined by an input analog signal. An input signal is typically applied to a filter prior to application to the analog-to-digital converter. The presence of the filter can result in an offset voltage signal as part input signal applied to the analog-to-digital converter.

Referring now to FIG. 1, an analog to digital converter transfer characteristic (according to a circuit implementation referred to as an A-Law encoder) is shown. The larger segments of FIG. 1 are generally called chords and the incremental steps within each chord are referred to as steps. There are 16 chords (8 positive chords and 8 negative chords) with 16 segments per chord, making a total of 256 break points that can be encoded with an 8 bits output signal of an analog-to-digital encoder. The most significant bit of the digital output signal group (word) is the sign, the next three most significant bits indicate which of the 8 chords is being referred to (the larger the chord value, the larger the value of the voltage), and the last four of the 8 bits represent the step within the chord. Pulse Code Modulation analog-to-digital converters are generally divided into two portions, each of the portions identified with encoding of the a portion of the graph described above. An upper array of capacitors implements the encoding of the chords, while a lower array of capacitors implements the encoding of the steps within the chords.

Referring now to FIG. 2, a simplified schematic diagram of the two portions of the analog-to-digital converter is shown. The analog to digital conversion process as implemented by the converter shown in FIG. 2 is accomplished in the following manner. With the switch S1 turned on, the group of switches S2 are in position a so that the (analog) input signal is stored on the capacitor array. Next, the switch S1 is turned to the off position, i.e. removes the capacitor bank from ground, and the group of switches S2 turns to the b position so that the input of the comparator or summing node has a voltage equal to the input signal, but of opposite polarity. This first comparison gives the sign of the input signal which in turn gives the sign of the reference voltage that is to be used, i.e. $+V_{ref} - V_{ref}$. This initial operation determines the sign bit. After the sign of the output signal group has been determined, the appropriate reference voltage determined in the prior step, is applied to at least one capacitor terminal. The charge on the capacitor terminal is then distributed among the other capacitors to provide a voltage input to the comparator circuit and depending on the results of the comparator, a next approximation is attempted. Referring to FIG. 3, a decision tree is shown indicating how the successive approximation register technique is implemented. At each point at the decision tree, a determination is made if the resulting voltage from the input charge distributed among the capacitors is greater or is less than the input voltage. The next operation either increases or decreased the input charge and therefore the signal according to the result of the preceding comparison. Table 1 is included to show more details of the successive approximation technique as is implemented in the apparatus of FIG. 2.

TABLE 1

(A-LAW)

| SAR | WEIGHT | POSITIONS OF THE SWITCHES | | |
|---|---|---|---|---|
| | | c | d | b |
| 000 | 0 | / | S20 | S21–S27 |
| 001 | 64 | S20 | S21 | S22–S27 |
| 010 | 128 | S20–S21 | S22 | S23–S27 |
| 011 | 256 | S20–S22 | S23 | S24–S27 |
| 100 | 512 | S20–S23 | S24 | S25–S27 |
| 101 | 1024 | S20–S24 | S25 | S26–S27 |
| 110 | 2048 | S20–S25 | S26 | S27 |
| 111 | 4096 | S20–S26 | S27 | / |

Reference Weight = 8192
c = ±VREF
D = Output of the lower OP. AMP.
b = GND

The encoding operation is continued until the correct chord (referred to FIG. 1) has been identified. Once the chord has been determined, then the similar procedure is performed on the lower array for the step of the chord. The encoding process is performed for the lower array in a manner similar to the upper array. However, unlike the switches in the upper array, there is a direct correspondence between the four lower bits of the successive approximation register and the switches S3. For example, if the bit is a logic 1, switch S3 is in position b, otherwise switch S3 is in position a. It should be noted that for the particular configuration of the analog-to-digital converter shown in FIG. 2, the $V_{ref}$ used in the lower array has the opposite sign of the $V_{ref}$ used in the upper array.

Because of the different sources of errors present in the circuit, such as offset voltages in the comparator and in the previous stages of the system, the desired value of the voltage stored at summing node is not equal to $-V_{in}$ but equal to $-V_{in}$ plus $V_{offset}$. In the implementation in which the value of the $V_{off}$ is digitally stored in a dedicated offset voltage correction register, this correction is obtained by performing a digital-to-analog conversion of the dedicated register contents and application of the results to the input terminal of the analog to digital conversion.

A need has therefore been felt for apparatus and method for implementing the correction of the voltage at the summing node of the analog-to-digital converter for offset voltages and other error voltage levels without affecting the performance of the converter.

SUMMARY OF THE INVENTION

It is an object of the present invention to provide a method for an improved analog-to-digital converter for a successive approximation system.

It is another object of the present invention to provide an improved analog-to-digital converter for a successive approximation system that uses the principal of charge redistribution.

It is yet another object of the present invention to provide a analog-to-digital converter in a successive approximation system using the principal of charge redistribution that can provide for compensation of an offset voltage.

It is yet another object of the present invention to provide for the incorporation of an offset voltage or error voltage into the signal applied to an analog-to-digital converter in a successive approximation system.

It is yet another object of the present invention to provide an analog-to-digital converter in a successive approximation system using the principal of charge redistribution that can provide compensation for offset voltages, wherein the value of the offset voltage is stored in a dedicated offset voltage correction register.

These and other objects of the present invention are accomplished, according to the present invention, by using the basic charge redistribution scheme and adding supplementary capacitors in both the upper array of the chord determining circuit and in the lower array of the step determining circuit.

These and other features of the invention will be understood upon reading of the following description along with the figures.

BRIEF DESCRIPTION OF THE DRAWINGS

FIG. 1 is an analog to digital conversion transfer characteristic using the A-law formalism.

FIG. 2 is an implementation of an analog-to-digital converter using charge redistribution with an upper and a lower array according to the prior art.

DESCRIPTION OF THE PREFERRED EMBODIMENT

Detailed Description of the Figures

Figure 4:
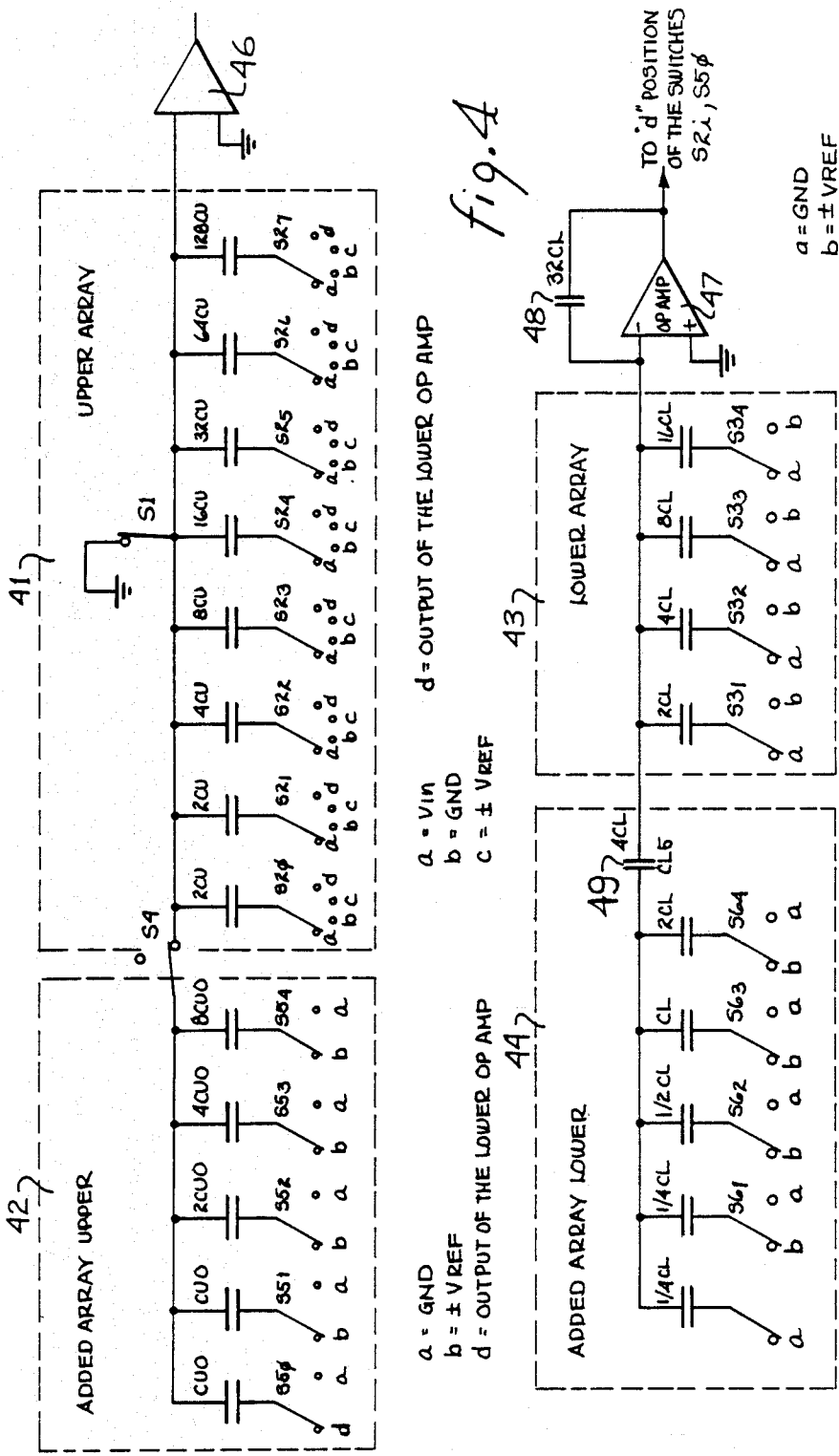
FIG. 4 shows an implementation of an analog to digital converter using a method of offset subtraction of the present invention.

Referring now to FIG. 4, an upper principal array of capacitors 41 is coupled to an input terminal of the comparator. Each of the capacitors in the input stage 41 has a first terminal coupled to an input terminal of comparator 46, a second terminal coupled to a four-position switch that can select between the input voltage $V_{in}$, the ground potential, a V+ and V− reference voltage potential, and a output of the operational amplifier 47. The first terminals of the array of capacitors 41 is coupled to a switch S1. The added first supplementary upper capacitor array 42 has the first terminals of capacitors coupled to the main array through switch S4, while the second terminal of the capacitors is coupled to a switch that selects to the plus or minus voltage reference $+V_{REF}$ or $-V_{REF}$, or ground. However, one capacitor of the first supplementary capacitor array can be coupled either to the ground potential or to the output of the operational amplifier 47. The second input terminal of comparator 46 is coupled to ground potential. For the less significant bits, a secondary lower array of capacitors 43 have a first terminal coupled to the inverting input terminal of operational amplifier 47 and a second terminal coupled to a two position switch that can select between the ground potential and a minus or plus voltage reference potential $+V_{REF}$ or $-V_{REF}$. The non-inverting input terminal of the operational amplifier 47 is coupled to ground potential while a feedback capacitor 48 is coupled between the output terminal and the inverting terminal of the operational amplifier. A second supplementary array of capacitors 44 have first terminals that are coupled through a capacitor 49 to the inverting input terminal of the operational amplifier 47, and have a second terminal coupled to a plurality of switches that couple the capacitor either to a ground position or to the minus or plus voltage reference position, $+V_{REF}$ or $-V_{REF}$.

Figure 3:
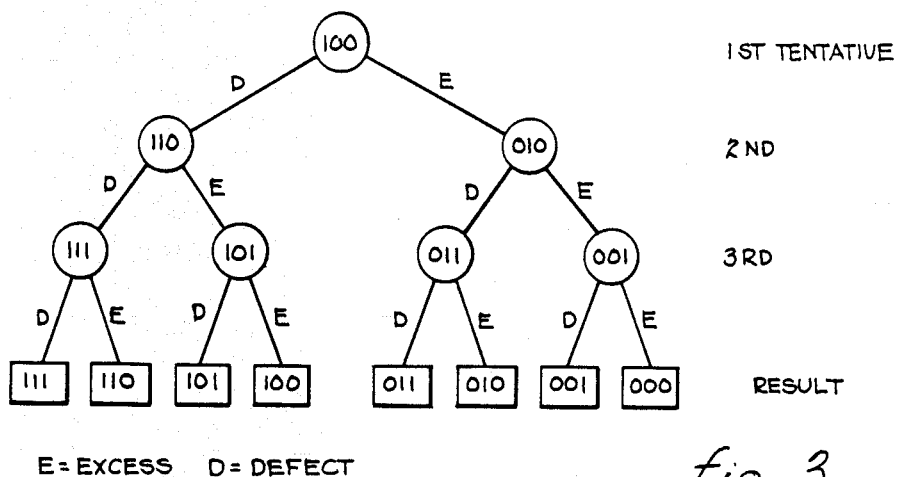
FIG. 3 is an illustrative decision tree for a successive approximation technique for digitalizing an analog input signal.
Figure 5:
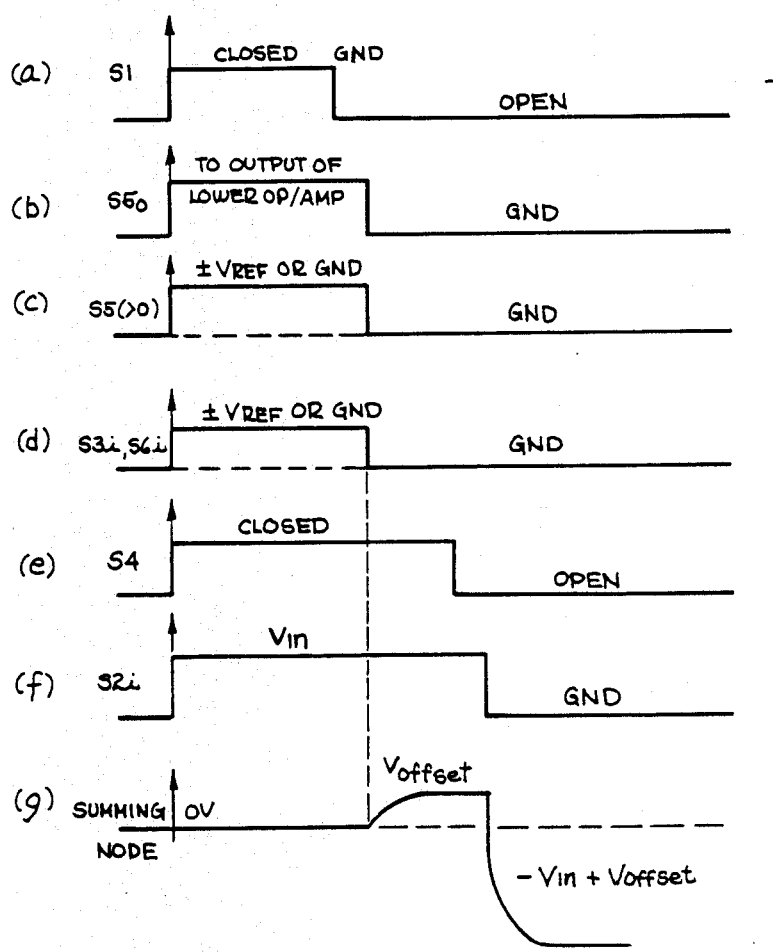
FIG. 5 illustrates the timing sequence of the switching circuits of the analog to digital converter of the present invention.

Referring next to FIG. 5, diagram a shows the voltage of the switch S1 with time, the switch first being closed and then being open. Diagram b shows the voltage of switch S50 with time. With reference to FIG. 5 of the drawings, there are signals (for example S1) that provide a continuous curve as shown. Otherwise, S51-S54, for example, can be VREF or Ground according to the driving code. For this reason, a continuous curve and a broken curve during the same time interval are shown. Diagram c shows the voltage of switches S51-S54. Diagram d shows the voltage of switches S6i and S3i with time. Diagram e shows the voltage of switch S4 with time, while diagram f shows the voltage of switches S2i. Diagram g shows the voltage at the summing node with time.

Operation of the Preferred Embodiment

The A/D converter for which the offset or error voltage correction is to be applied to the input signal have a plurality of capacitors, namely a primary capacitor array and a secondary capacitor array. An input signal supplies a charge system and a multiplicity of known incremental charges are successively compared to the charge from the input signal. When the input charge and the charge from the known increments are equal within the gradients of the system, the switches providing the incremental charges provide a digital representation of the input signal. To this system, the present invention provides a dedicated offset voltage correction register storing a digital representation of a correction signal, such as correcting for an offset signal. Prior to the comparison of the charge resulting from the input signal and the incremental charges, the contents of the dedicated offset voltage correction register are used to store charges on first supplementary capacitor array, the amount of charge stored in the secondary capacitors providing an analog representation of the correction signal. This correction charge is then combined with the input signal charge and a correction is achieved.

The operation of the system shown in FIG. 4 differs from the prior art system in the initial phase of every analog-to-digital conversion according to a different timing sequence shown in FIG. 5. Simultaneously with the storage of an input signal in the principal capacitor array, the switch S5₀ goes to position d. The switches S5₁ to S5₄, as well as all switches, S3i and S6i, are coupled to ground or are coupled to $V_{ref}$ according to the value of the associated bit in the dedicated offset register. In this way, the first supplementary capacitor array receives a an initial charge equivalent to the complement of the offset value stored in the dedicated register. In the next phase, the switch S1 goes off and all the switches S5i are coupled to ground potential (position a). This operation creates a variation of the voltage at the summing nodes equal to the offset. When the switch S4 is turned off and the switches S2i are coupled to ground potential, the summing node voltage equals to −Vin +Voff. It is worth mentioning that the turn-off of the switch S4 isolates the primary and secondary capacitor arrays from the first supplementary capacitor arrays for the subsequent operation of the analog to digital conversion so that once the offset correction is done, the system operates identical to a conventional one in which there are no supplementary capacitors. Given an analog-to-digital converter and its voltage reference $V_{REF}$ such as is shown in FIG. 4, the main consideration raised to the values of the supplementary arrays are as follows. The value of the unit capacitor Cuo of the added first supplementary upper capacitor array, as well as the total number of units determine the maximum amount of voltage that can be added to the summing node (which in turn is directly related to the maximum expected value of the system offset voltage). The added second supplementary lower capacitor array has the smallest capacitor (one quarter $C_L$) and in conjunction with the value CUO determines the minimum increment of the offset correction at the summing node. In the example shown, the dedicated register for the offset voltage correction has 12 bits that can be separated into groups of four bits each separated as follows. The lowest group drives the added second supplementary lower capacitor array, the medium group drives the lower secondary array which is inactive during the sampling of $V_{in}$, and the highest group drives the added first supplementary upper capacitor array. In this example, the voltage correction at the summing node has a linear variation with respect to the digital value stored in the dedicated offset correction register.

The purpose of the series capacitor $CL_S$ of the lower array is to allow achieving a small voltage increment at the summing node using relatively larger values of unit capacitors which yields better precision. In this case, since $CL_S = 4 C_L$, the change in voltage at the output of the operational amplifier of the lower secondary capacitor array due to the capacitor size $\frac{1}{4} C_L$ is the same as a change of voltage that would be obtained by short-circuiting $C_{LS}$ and replacing the capacitor of size $\frac{1}{4} C_L$ by a smaller one of size $\frac{1}{8} C_L$. With this consideration in mind, the minimum change at the output of the operational amplifier is equal to 1/256 $V_{ref}$. At the end of the operation of the digital-to-analog converter for correction of the offset, the voltage at the output of the operation amplifier, appears at the summing node attentuated by a value equal to $$C_{uo}/(16 C_{uo} + 256 C_u)$$

because a capacitor of value $C_{uo}$ has a weight, at the end of the conversion of the offset, equal to $$C_{uo}/(16 C_{uo} + 256 C_u)$$

With the previous considerations in mind, the result of the digital to analog conversion of a value B stored in the dedicated register becomes:

$$\frac{1}{256} \left( \frac{C_{uo}}{16 C_{uo} + 256 C_u} \right) \sum_{i=0}^{11} B_i 2^i$$

As an example, having $C_{uo} = C_u$ and $V_{ref} = 3.0$ V, the minimum increment in the offset correction is:

$$\frac{1}{256} \frac{1}{256 + 16} V_{ref} = \frac{1}{69632} V_{ref} = 43.08\ \mu V$$

while the maximum offset that can be compensated is:

$$\frac{16}{256 + 16} V_{ref} = \frac{16}{272} V_{ref} = 176.47\ mV$$

The above discussion is included to illustrate the operation of the preferred embodiment and is not meant to limit the scope of the invention. The scope of the invention is to be limited only by the following claims. From the foregoing description, many variations will be apparent to one skilled in the art that would yet be encompassed by the spirit and scope of the invention.

What is claimed is:

1. A method of correcting for error voltages, such as offset voltages present in circuitry of systems using voltage comparators, said method comprising the steps of:
   (a) providing a successive approximation analog-to-digital converter provided with a primary capacitor array interconnected with a first switch means used for grounding a summing node on said converter and a second switch means for providing an input signal charge to said primary capacitor array, said input signal charge representing a chord value of said input signal charge;
   (b) providing a dedicated offset voltage correction register for storing a digital representation of a correction signal;
   (c) providing a first supplementary capacitor array for storing charges representing an analog of a major portion of a correction signal, said first supplementary capacitor array being provided in addition to said provided primary capacitor array;
   (d) providing a third switch means between said first supplementary capacitor array and said provided primary capacitor array, said third switch being located to assure isolation of said first supplementary capacitor array from said provided primary capacitor array after performing a correction;
   (e) storing a digital representation of a correction signal in said dedicated correction register;
   (f) storing an input signal charge, representing a chord value of said input signal, in said primary capacitor array through said second switch means;
   (g) grounding said summing node of said successive approximation analog-to-digital converter through said first switch means;
   (h) closing said third switch means between said first supplementary capacitor array and said primary capacitor array;
   (i) performing a digital-to-analog conversion of said stored correction signal in said dedicated offset correction register, said conversion being performed simultaneous with said steps of storing said input signal and grounding said summing node and closing said third switch means;
   (j) precharging said first supplementary capacitor array with a major portion of a correction signal charge equivalent to an analog value resulting from said performed digital-to-analog conversion step;
   (k) opening said first switch means;
   (l) raising the voltage potential at said summing node by an amount equivalent to said stored major portion of said correction signal charge in said first supplementary capacitor array;
   (m) opening said third switch means in a timely manner and thereby isolating said first supplementary capacitor array from said primary capacitor array without affecting normal operation of said successive approximation analog-to-digital converter;

(n) grounding said primary capacitor array through said second switch means;

(o) combining an input voltage equivalent of said input signal charge and an offset voltage equivalent of said correction signal charge at said summing node and thereby providing a compensated input value at said summing node; and (p) operating said successive approximation analog-to-digital converter.

2. A method of correcting for error voltages as recited in claim 1, wherein:

(a) said step of providing a successive approximation analog-to-digital converter further includes providing a secondary capacitor array for storing a step value of said input signal charge;

(b) said step of providing a first supplementary capacitor array further includes providing a second supplementary capacitor array for correcting for a minimum increment of said correction signal;

(c) said step of storing a digital representation of a correction signal in said dedicated correction register includes storing both major and minimum increment of said correction signal;

(d) said step of storing an input signal charge includes storing both a chord value and a step value of said input signal charge in said primary capacitor array and said secondary capacitor array, respectively;

(e) said step of closing said third switch means between said first supplementary capacitor array and said primary capacitor array includes electronically coupling to said second supplementary capacitor array;

(f) said step of performing a digital-to-analog conversion of said stored correction signal in said dedicated offset correction register, includes conversion of a combined major portion and minimum increment of said correction signal;

(g) said step of precharging said first supplementary capacitor array includes precharging said second supplementary capacitor array with a minimum increment of a correction signal charge;

(h) said step of raising the voltage potential at said summing node includes raising said voltage potential by an amount equivalent to said stored minimum increment of said correction signal charge in said second supplementary capacitor array;

(i) said step of combining includes combining both chord and step portions of an input signal charge and a major and minimum increment of said correction signal charge at said summing node; and (j) said step of opening said third switch means in a timely manner includes isolating said first supplementary capacitor array and said second supplementary capacitor array from said primary capacitor array after offset voltage correction, for purposes of not affecting normal operation of said successive approximation analog-to-digital converter.

3. An analog-to-digital converter comprising:

(a) a successive approximation analog-to-digital converter provided with a primary capacitor array interconnected with a first switch means used for grounding a summing node on said converter and a second switch means for providing an input signal charge to said primary capacitor array, said input signal charge representing a chord value of said input signal charge;

(b) a dedicated offset voltage correction register for storing a digital representation of a correction signal;

(c) a first supplementary capacitor array for storing charges representing an analog of a major portion of a correction signal, said first supplementary capacitor array being provided in addition to said provided primary capacitor array;

(d) a third switch means between said first supplementary capacitor array and said provided primary capacitor array, said third switch being manipulated for isolating said primary capacitor array from said first supplementary capacitor array after offset voltage correction, for purposes of not affecting normal operation of said successive approximation analog-to-digital converter; and (e) a control means for controlling:

(1) the storing of a digital representation of a correction signal in said dedicated correction register, (2) the storing of an input signal charge representing a chord value of said input signal in said primary capacitor array through said second switch means, (3) the grounding of said summing node of said successive approximation analog-to-digital converter through said first switch means, (4) the closing of said third switch means between said first supplementary capacitor array and said primary capacitor array, and isolating of said first supplementary capacitor array from said primary capacitor array after offset voltage correction, for purposes of not affecting normal operation of said successive approximation analog-to-digital converter, (5) the performing of a digital-to-analog conversion of said stored correction signal in said dedicated offset correction register, said conversion being performed simultaneous with storing said input signal and grounding said summing node and closing said third switch means, (6) the precharging of said first supplementary capacitor array with a major portion of a correction signal charge equivalent to an analog value resulting from said performed digital-to-analog conversion step, (7) the opening of said first switch means, (8) the raising of a voltage potential at said summing node by an amount equivalent to said stored major portion of said correction signal charge in said first supplementary capacitor array, (9) the grounding of said primary capacitor array through said second switch means,

(10) the combining of an input voltage equivalent of said input signal charge and an offset voltage equivalent of said correction signal charge at said summing node and thereby providing a compensated input value at said summing node,

(11) the opening of said third switch means in a timely manner and thereby isolating said first supplementary capacitor array from said primary capacitor array without affecting normal operation of said successive approximation analog-to-digital converter, and

(12) the operating of said successive approximation analog-to-digital converter.

4. An analog-to-digital converter as recited in claim 3, further comprising:
  (a) a successive approximation analog-to-digital converter further provided with a secondary capacitor array for storing a step value of said input signal charge;
  (b) a second supplementary capacitor array capacitively coupled to said secondary capacitor array for correcting for a minimum increment of said correction signal;
  (c) a control means for further controlling:
    (1) the storing of a digital representation of a correction signal in said dedicated correction register which includes storing both major and minimum increment of said correction signal,
    (2) the storing of an input signal charge which includes storing both a chord value and a step value of said input signal charge in said primary capacitor array and said secondary capacitor array, respectively,
    (3) the closing of said third switch means between said first supplementary capacitor array and said primary capacitor array which includes electronically coupling to said second supplementary capacitor array and isolating of said first supplementary capacitor array and said second supplementary capacitor array from said primary capacitor array after offset voltage correction, for purposes of not affecting normal operation of said successive approximation analog-to-digital converter, after offset voltage correction is done normal operations of said converter,
    (4) the performing of a digital-to-analog conversion of said stored correction signal in said dedicated offset correction register, which includes conversion of a combined major portion and minimum increment of said correction signal,
    (5) the precharging of said first supplementary capacitor array and said second supplementary capacitor array with a minimum increment of a correction signal charge,
    (6) the raising of a voltage potential at said summing node which includes raising said voltage potential by an amount equivalent to said stored minimum increment of said correction signal charge in said second supplementary capacitor array, and
    (7) the combining of both chord and step portions of an input signal charge and both a major and minimum increment of said correction signal charge at said summing node.

* * * * *